(12) United States Patent
Araki

(10) Patent No.: US 7,169,516 B2
(45) Date of Patent: Jan. 30, 2007

(54) DYE-CONTAINING CURABLE COMPOSITION, COLOR FILTER AND METHOD OF MANUFACTURING THE SAME

(75) Inventor: Katsumi Araki, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 439 days.

(21) Appl. No.: 10/606,185

(22) Filed: Jun. 26, 2003

(65) Prior Publication Data

US 2004/0009414 A1  Jan. 15, 2004

(30) Foreign Application Priority Data

Jun. 28, 2002 (JP) ............... 2002-189678
Feb. 18, 2003 (JP) ............... 2003-039376

(51) Int. Cl.
 *G02B 5/20* (2006.01)
 *G03F 7/00* (2006.01)

(52) U.S. Cl. ...................... 430/7; 430/270.1

(58) Field of Classification Search ............ None
See application file for complete search history.

(56) References Cited

FOREIGN PATENT DOCUMENTS

| JP | 59-30509 A | | 2/1984 |
|---|---|---|---|
| JP | 2-199403 A | | 8/1990 |
| JP | 5-333207 A | * | 5/1992 |
| JP | 5-273411 A | | 10/1993 |
| JP | 6-75375 A | | 3/1994 |
| JP | 2002-228831 A | * | 8/2005 |

* cited by examiner

*Primary Examiner*—John A. McPherson
(74) *Attorney, Agent, or Firm*—Sughrue Mion, PLLC

(57) ABSTRACT

A dye-containing curable composition which contains a binder and an organic solvent soluble dye, and in which the organic solvent soluble dye is a compound represented by the following general formula (I), and a color filter formed by using this compound. In general formula (I), Dye represents an acidic dye portion having a sulfonic acid group or a carboxylic acid group; X represents a portion derived from at least one of a nitrogen-containing compound with a molecular weight of 250 or less having carbon, hydrogen, and two or more nitrogen atoms, and an aliphatic cyclic amine compound with a molecular weight of 250 or less having carbon, hydrogen and one or more nitrogen atoms; and n represents a value that satisfies $0 < n \leq 5$.

$$\text{Dye} \cdot X_n \qquad \text{General formula (I)}$$

17 Claims, No Drawings

DYE-CONTAINING CURABLE COMPOSITION, COLOR FILTER AND METHOD OF MANUFACTURING THE SAME

CROSS-REFERENCE TO RELATED APPLICATION

This application claims priority under 35USC 119 from Japanese Patent Application Nos. 2002-189678 and 2003-39376, the disclosure of which is incorporated by reference herein.

BACKGROUND OF THE INVENTION

1. Field of the Invention

The present invention relates to a dye-containing curable composition suitable for forming a colored image, which constitutes a color filter used in liquid crystal display devices or solid image pickup devices, as well as a color filter using the dye-containing curable composition, and a method of manufacturing the same.

2. Description of the Related Art

As a method of manfacturing color filters using a photoresist, the following methods have long been known: staining technique comprising pattern formation with a photoresist, followed by pattern staining; electrodeposition comprising formation of a pre-patterned transparent electrode and subsequent pattern formation by ionization of a resin containing pigment dissolved/dispersed in a solvent by voltage application; printing method by offset printing with ink containing thermosetting resin or ultraviolet-curing resin; and pigment dispersing method using a color-resist agent in which a coloring agent such as pigment is dispersed in a photoresist material. Recently major method is the pigment-dispersing method.

Specifically, a colored radiosensitive composition is applied on a substrate by a spin coater or roller coater, and dried to form a film, on which pattern exposure is made and developed to generate colored pixels. This operation is repeated plural times according to the number of hue to give a color filter. For example, these processes are described in JP-A Nos. 1-102469, 1-152499, 2-181704, 2-199403, 4-76062, 5-273411, 6-184482, and 7-140654.

In recent years, the application of color filters has been expanded from liquid crystal display devices (LCD) to solid image pickup devices such as CCDs. In other words, in the solid image pickup devices, there have been strong demands for higher precision, and the pixels tend to be miniaturized in accordance with a higher density in picked up images. From this point of view, an organic pigment for use as a colorant inevitably needs to have finer particles. There is a limitation, however, in the primary particle size of the organic pigment, resulting in color irregularities caused by bulky particles. In order to solve such a problem, for example, JP-A No. 6-75375 has proposed a dye-type curable composition by incorporating a dye as a coloring agent in the medium of the curable composition in a dissolved state, and examined its practical use.

However, the curable composition containing a dye gives rise to other problems described below:

(1) Since a conventional pigments are low in solubility in either an alkaline aqueous solution or an organic solvent, it is difficult to obtain a liquid curable composition having a desired spectrum;

(2) Since most of dyes interact with another component contained in the curable composition, it is difficult to adjust the solubility of the cured portion and non-cured portion (developing property);

(3) When the molar extinction coefficient ($\epsilon$) of the dye is small, a large amount of the dye needs to be added so that other components, such as a polymerizable compound (monomer), a binder and a photo-polymerization initiator, in the curable composition have to be reduced, causing problems such as poor curing property in the composition, degradation in heat resistance after curing and degradation in the developing property in (non)cured portions; and (4) Dyes are in general inferior to pigments in light resistance and heat resistance.

Moreover, when used in production of a color filter for use in a solid image pickup device, the film thickness of the composition has to be in 1.5 µm or thinner. Therefore, it is necessary to add a large amount of pigment into a curable composition, resulting in the above-mentioned problems.

As described above, it has been difficult to achieve appropriate performances required for practical use as a high-precision color filter for a solid image pickup device, that is, miniaturized colored patterns and thin-films.

On the other hand, for example, JP-A No. 59-30509 has disclosed a color solid image pickup device which employs an acidic dye that has a pyridinium cation, a quinorium cation and a quaternary ammonium ion containing only one nitrogen atom as a counter cation. When the counter cation of the acidic dye is a cation containing a nitrogen atom, only one nitrogen ion is contained in one counter cation. Further it is not an aliphatic cyclic amine compound having no unsaturated bond when the aliphatic cyclic amine compound contains only one nitrogen atom. There is a problem that the resulting pattern (pixels) is insufficient in its solvent resistance, and further improvements have been demanded.

SUMMARY OF THE INVENTION

The present invention has been made to solve the above-mentioned problems, and its object is to provide a dye-containing curable composition which is superior in the curing property with high sensitivity as well as wide developing latitudes, and is, in particular, superior in the solvent resistance in an image portion (for example, pixels) after curing process, with superior curing property and heat resistance; thus, it becomes possible to form a good pattern image having superior hues with a high degree of resolution.

The invention makes it possible to provide a color filter with high productivity, which is formed by the above-mentioned dye-containing curable composition, has high transmittance and high resolution with wide developing latitudes, and is also superior in the solvent resistance, curing property and heat resistance.

Another object of the invention is to provide a method of manufacturing color-filter with a good cost performance (high efficiency and high productivity), which can form and cure patterns with high sensitivity and high hardness, can prevent the elusion and mixture (mixed colors) of the dye and is superior in solvent resistance for each pattern, and also superior in the hues, resolution, heat resistance and light resistance.

The following description will explain specific means prepared so as to solve the above-mentioned problems.

A first embodiment of the invention provides a dye-containing curable composition containing a binder and an organic solvent soluble dye, wherein the organic solvent soluble dye is a compound represented by the following general formula (I):

Dye·$X_n$     General formula (I)

In general formula (I), Dye represents an acidic dye portion having at least one of a sulfonic acid group and a carboxylic acid group; and X represents a portion which is derived from at least one selected from the group consisting of a nitrogen-containing compound with a molecular weight (Mw) of 250 or less having carbon, hydrogen, and two or more nitrogen atoms, and an aliphatic cyclic amine compound with a molecular weight (Mw) of 250 or less having carbon, hydrogen, and one or more nitrogen atoms. Here, n represents a value that satisfies $0<n\leq5$.

A second embodiment of the invention provides the dye-containing curable composition of the first embodiment, wherein Dye (acidic dye portion) in general formula (I) is a portion derived from at least one selected from the group consisting of an azo-type acidic dye, a xanthene-type acidic dye, and a phthalocyanine-type acidic dye.

A third embodiment of the invention provides the dye-containing curable composition of the first or second embodiment, wherein Dye (acidic dye portion) in general formula (I) is a portion derived from at least one selected from the group consisting of a monoazo-type acidic dye and a bisazo-type acidic dye.

A fourth embodiment of the invention provides the dye-containing curable composition of any one of the first to third embodiments, wherein the binder is a water-soluble or alkali-soluble binder, and in addition to the binder and the organic solvent soluble dye, the dye-containing curable composition contains a photo-polymerization initiator and a monomer or oligomer that contains at least one ethylenic unsaturated group.

A fifth embodiment of the invention provides the dye-containing curable composition of any one of the first to fourth embodiments, further containing a cross-linking agent.

A sixth embodiment of the invention provides a color filter containing the dye-containing curable composition of any one of the first to fifth embodiments.

A seventh embodiment of the invention provides a method of manufacturing a color filter comprising the steps of: applying the dye-containing curable composition of any one of the first to fifth embodiments onto a support, exposing the dye-containing curable composition on the support through a mask, and developing the dye-containing curable composition on the support so as to form a pattern.

In the method of manufacturing a color filter, when forming a color filter having desired hues, the processes are repeated a number of times corresponding to the number of the desired hues. Another embodiment including a process for curing the pattern by heating and/or exposure to light, when necessary, is also preferable.

DETAILED DESCRIPTION OF THE INVENTION

The following description will detail the dye-containing curable composition of the present invention, a color filter produced by using the dye-containing curable composition and a manufacturing method thereof.

<<Dye-containing Curable Composition>>

The dye-containing curable composition of the invention contains at least a binder and an organic solvent soluble dye, and generally contains a solvent (hereinafter, referred to as an organic solvent). A compound represented by the following general formula (I) is contained as the organic solvent soluble dye. When a positive-working-type structure is to be formed, the dye-containing curable composition of the invention may contain o-naphthoquinone diazide compound together with the binder and organic solvent soluble dye. On the other hand, when a negative-working-type structure is to be formed, the dye-containing curable composition of the invention may contain a photo-polymerization initiator and a monomer or oligomer having at least one ethylenic unsaturated group. Furthermore, a cross-linking agent and other components may be contained therein. If necessary, in the case of the positive-working-type structure, the above-mentioned monomer or oligomer and the photo-polymerization initiator may be further contained.

—Organic Solvent Soluble Dye—

The dye-containing curable composition of the invention contains a compound represented by the following general formula (I) as an organic solvent soluble dye. The compound is a salt of an acidic dye (Dye in general formula (I)) and a nitrogen-containing compound or an aliphatic cyclic amine compound (X in general formula (I)).

Dye·X$_n$     General formula (I)

In general formula (I), Dye represents a portion derived from an acidic dye having at least a sulfonic acid group or a carboxylic acid group, and the acidic dye will be described in detail later. X, which is a counter ion forming a salt with Dye, represents a portion which is derived from at least one selected from the group consisting of a nitrogen-containing compound with a molecular weight Mw of 250 or less having carbon, hydrogen, and two nitrogen atoms, and an aliphatic cyclic amine compound with a molecular weight Mw of 250 or less having carbon, hydrogen, and one or more nitrogen atoms. The compound represented by X will be described in detail later. Here, n represents a value that satisfies $0<n\leq5$.

The following description will explain the acidic dye that constitutes Dye. The acidic dye is not particularly limited as long as it contains an acidic group of a sulfonic acid or a carboxylic acid, and is appropriately selected by taking into consideration all the necessary performances such as solubility with respect to an organic solvent and a developer, a salt-forming property, light absorbency, interaction with the other components in the composition, light resistance, and heat resistance.

The specific examples of the acidic dye include the following. However, these examples should not be construed to limit the invention.

acid alizarin violet N;
acid black 1, 2, 24, 48;
acid blue 1, 7, 9, 15, 18, 23, 25, 27, 29, 40, 45, 62, 70, 74, 80, 83, 86, 87, 90,92, 103, 112, 113, 120, 129, 138, 147, 158, 171, 182, 192;
acid chrome violet K;
acid Fuchsin;
acid green 1, 3, 5, 9, 16, 25, 27, 50;
acid orange 6, 7, 8, 10, 12, 50, 51, 52, 56, 63, 74, 95;
acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, 274;
acid violet 6B, 7, 9, 17, 19;
acid yellow 1, 3, 7, 9, 11, 17, 23, 25, 29, 34, 36, 42, 54, 72, 73, 76, 79, 98, 99, 111, 112, 114, 116;
Food Yellow 3;

and derivatives of these dyes.

Among these acidic dyes, more preferable examples are: acid black 24; acid blue 23, 25, 29, 62, 86, 87, 92, 138, 158; acid orange 8, 51, 56, 74, 63, 74; acid red 1, 4, 8, 34, 37, 42, 52, 57, 80, 97, 114, 143, 145, 151, 183, 217; acid violet 7; acid yellow 17, 25, 29, 34, 42, 72, 76, 99, 111, 112, 114, 116; and derivatives of these dyes.

Moreover, an azo-type acidic dye, a xanthene-type acidic dye or a phthalocyanine-type acidic dye other than the above-mentioned dyes is preferably used, and preferable examples thereof include acidic dyes such as C. I. Solvent Blue 44, 38, C. I. Solvent Orange 45, Rhodamine B, Rhodamine 110, 2, 7-Naphthalenedisulfonic acid and 3-[(5-chloro-2-phenoxyphenyl) hydrazono]-3,4-dihydro-4-oxo-5-[(phenylsulfonyl) amino]-, and derivatives of these dyes.

The following description will explain a nitrogen-containing compound or an aliphatic cyclic amine compound that constitutes X in general formula (I) and serves as a counter ion to the above-mentioned acidic dye.

The nitrogen-containing compound, represented by X, has a chain or branched structure containing a carbon atom, a hydrogen atom, and two or more nitrogen atoms. It has a molecular weight of 250 or less. On the other hand, the aliphatic cyclic amine compound, represented by X, has a heterocyclic structure having no unsaturated bond containing a carbon atom, a hydrogen atom, and one or more nitrogen atoms. It has a molecular weight of 250 or less.

At least one of the nitrogen-containing compound and the aliphatic cyclic amine compound is selected to form a salt with the acidic dye, the salt being an organic solvent soluble dye. The nitrogen-containing compound or the aliphatic cyclic amine compound may be appropriately selected by taking into consideration all the properties such as solubility with respect to the organic solvent and developer, a salt-forming property, light absorbency of the dye, and interaction with the other components in the dye-containing curable composition.

A compound having a smaller molecular weight is preferable in pursuit of good light absorbency. In particular, the compound preferably has a molecular weight of 245 or less, more preferably 240 or less, and most preferably 230 or less. Moreover, the lower limit of the molecular weight is preferably 60 or more.

Preferable examples of the nitrogen-containing compound or the aliphatic cyclic amine compound include a compound that has a low oxidation potential (having a smaller ionization potential), a tertiary amine compound, an aliphatic cyclic amine compound, an aniline-type compound and a hydrazine-type compound.

It is preferable that the oxidation potential of the nitrogen-containing compound or the aliphatic cyclic amine compound is low (particularly 0.75 V or less (vs. Ag/Ag$^+$)). The oxidation potential is determined as described below. Sweeping is started so as to make the potential greater on the plus side (for example, ±0 V→+2.0 V). Then, when oxidation occurs, an oxidizing wave is measured. In general, the result of oxidation and reduction potential measurement is plotted with the horizontal axis indicating potential and the vertical axis indicating current flow between electrodes. In other words, the oxidation wave refers to a waveform having a peak (apex) that swings toward the upper side of a base line that indicates no current flow. The waveform is expressed as a 1/2 wave of the oxidation potential. The peak (apex) voltage of the waveform is represented as Epa. Epa is measured by the following method.

A measuring device, in which an arbitrary function generator, a potentiostat and a measuring container are connected, is utilized. The measuring container contains 0.1 M of $(n\text{-}C_4H_9)_4N^+ClO_4^-$ (for use in polarograph, manufactured by Nakarai Chemical, Ltd.) serving as a supporting electrolyte, the $(n\text{-}C_4H_9)_4N^+ClO_4^-$ being dissolved in acetonitrile (manufactured by Kanto Kagaku K. K.) serving as a measuring solvent. As for electrodes, a Pt electrode is used as a working electrode, and an Ag/AgCl electrode (saturated KCl) is used as a reference electrode. Agar containing supporting salt $KNO_3$ (1M) is filled, serving as a salt bridge connecting the reference electrode and the measuring container. Under these conditions, a sample is dissolved in the measuring container to be $1\times10^{-4}$ M, and under the condition of 25° C., measurements are carried out at a sweeping speed of 50 mV/cm$^2$ to 1 V/cm$^2$.

Examples of the nitrogen-containing compound or the aliphatic cyclic amine compound include a hydrazine-type compound represented by the following general formula (II).

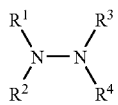

General formula (II)

In general formula (II), each of $R^1$, $R^2$, $R^3$ and $R^4$ independently represents a straight or branched alkyl group, and $R^1$ to $R^4$ have 14 or less carbon atoms in total. $R^1$, $R^2$, $R^3$ and $R^4$ may be bonded to each other to form an aliphatic ring. When provided with branched chains, $R^1$, $R^2$, $R^3$ and $R^4$ may form a bicyclo-ring with the branched chains being bonded to each other. Specific examples of this hydrazine type compound will be listed later.

Specific examples of the nitrogen-containing compound and the aliphatic cyclic amine compound include the following. However, these examples should not be construed to limit the invention.

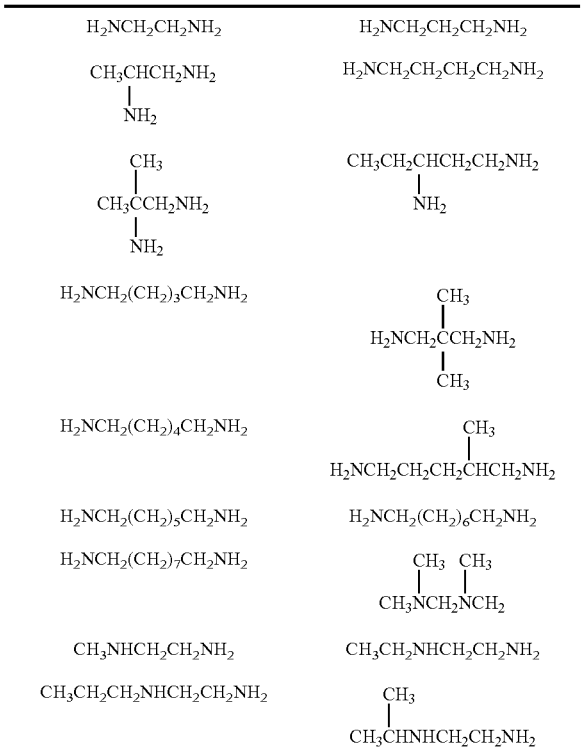

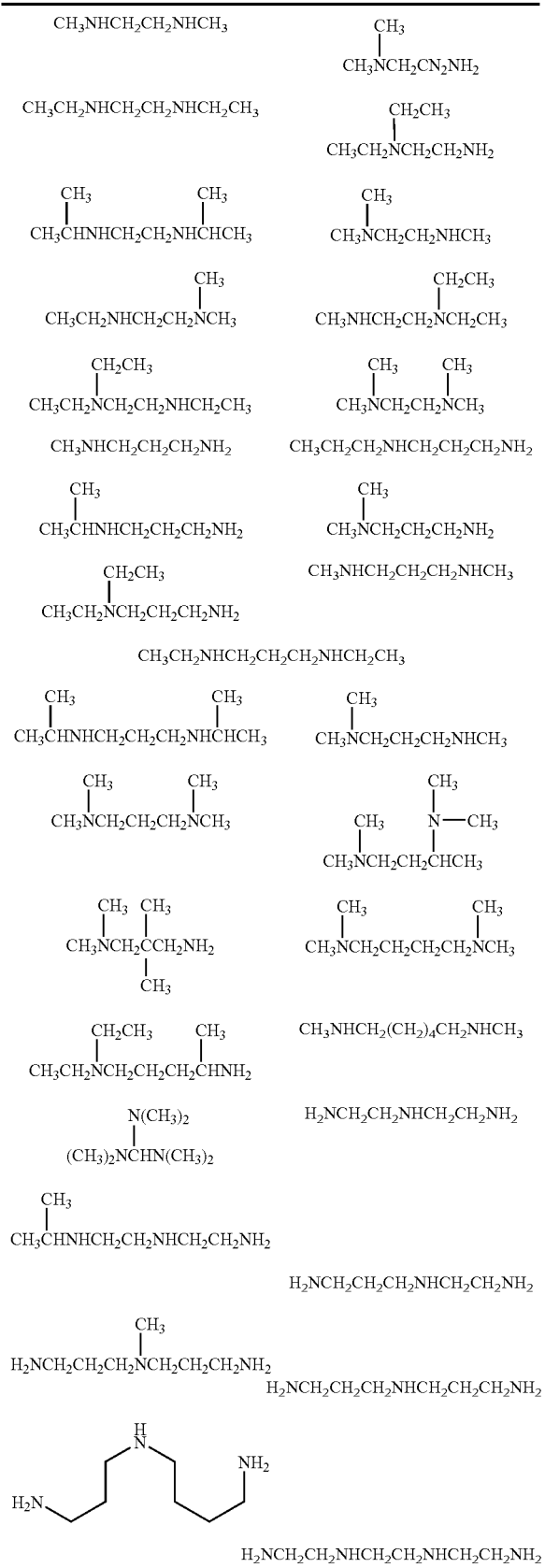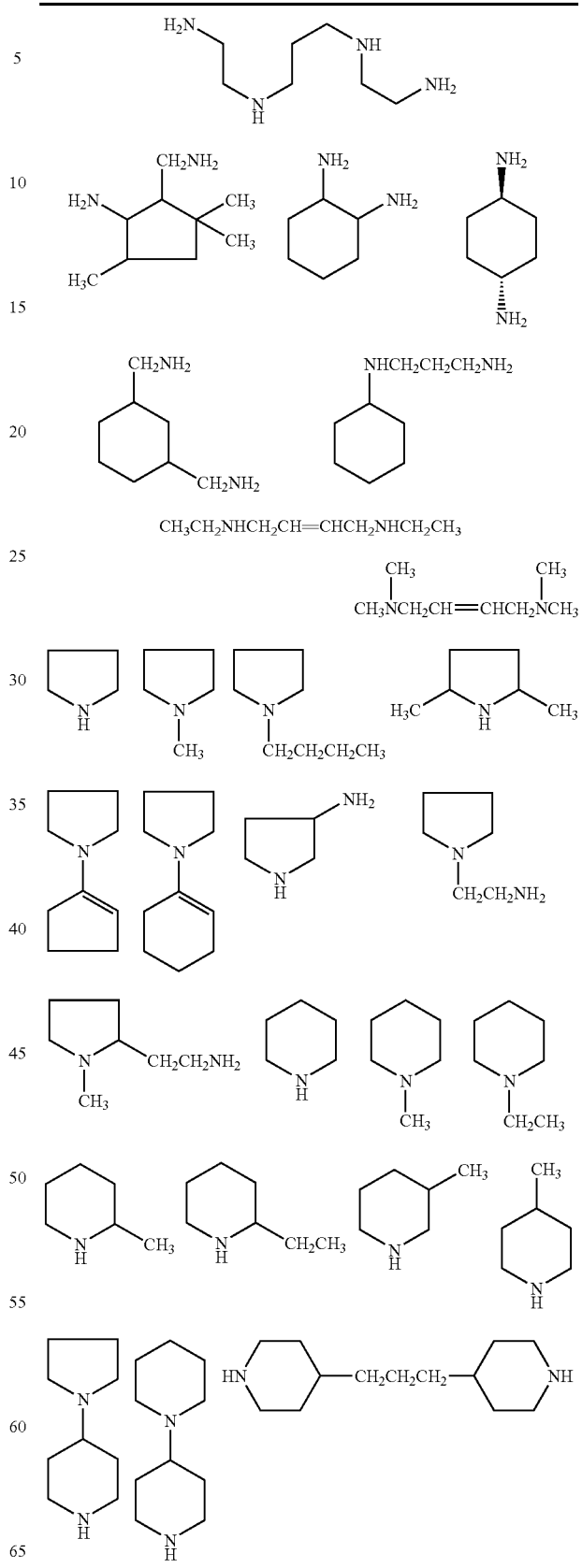

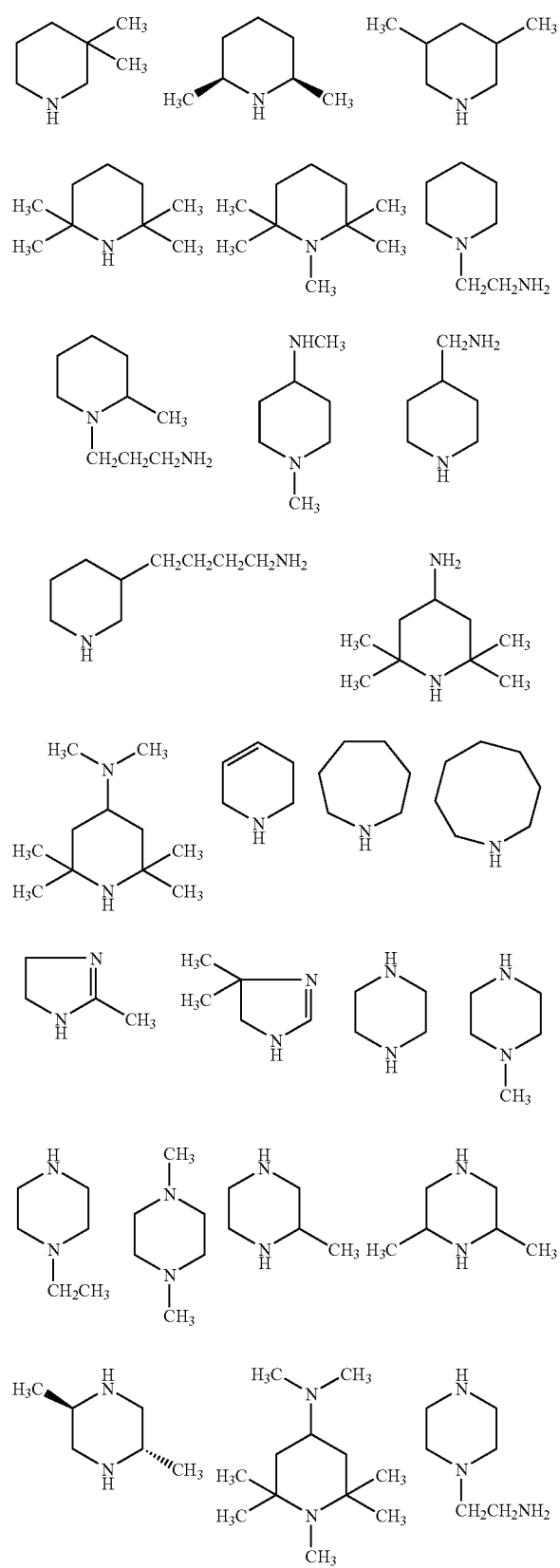
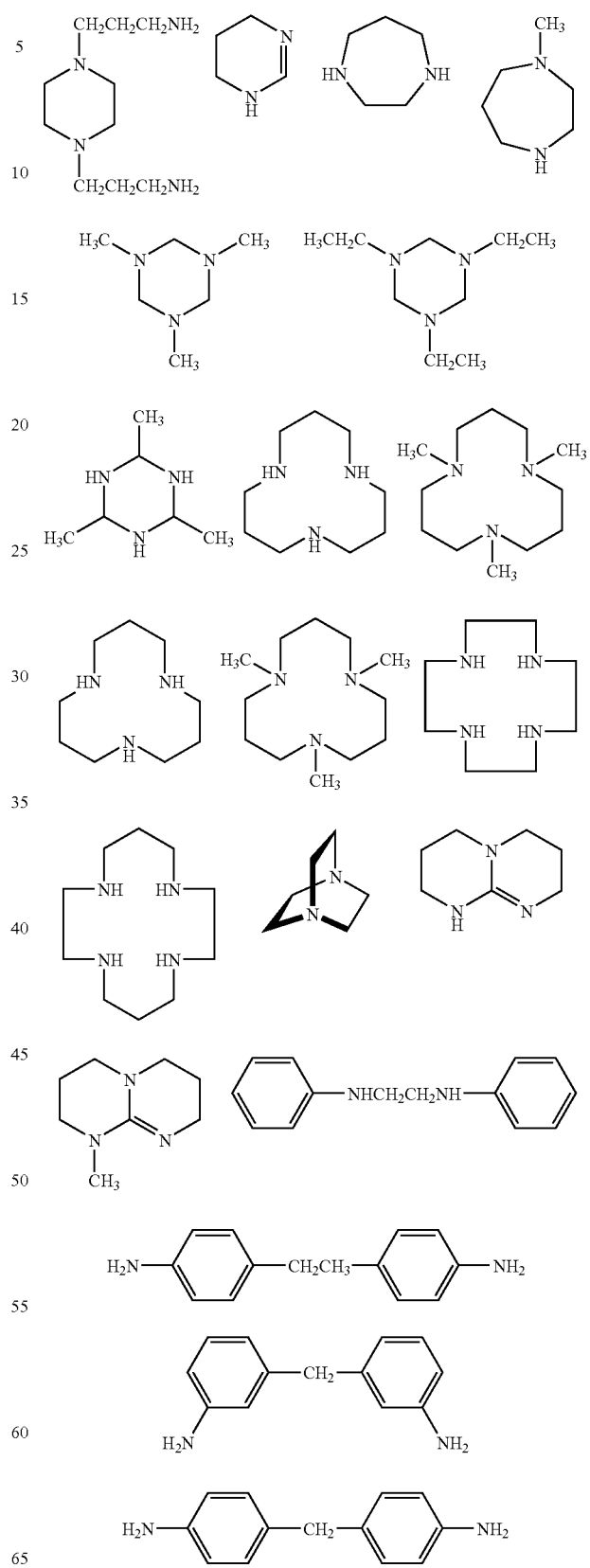

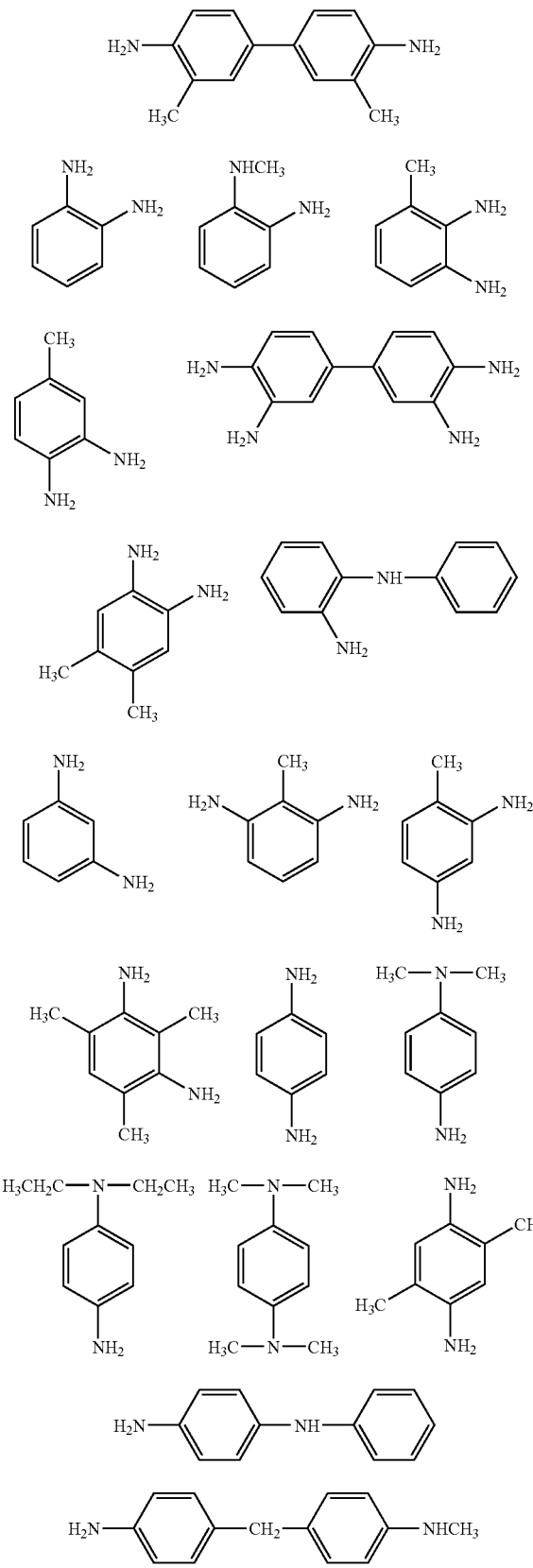
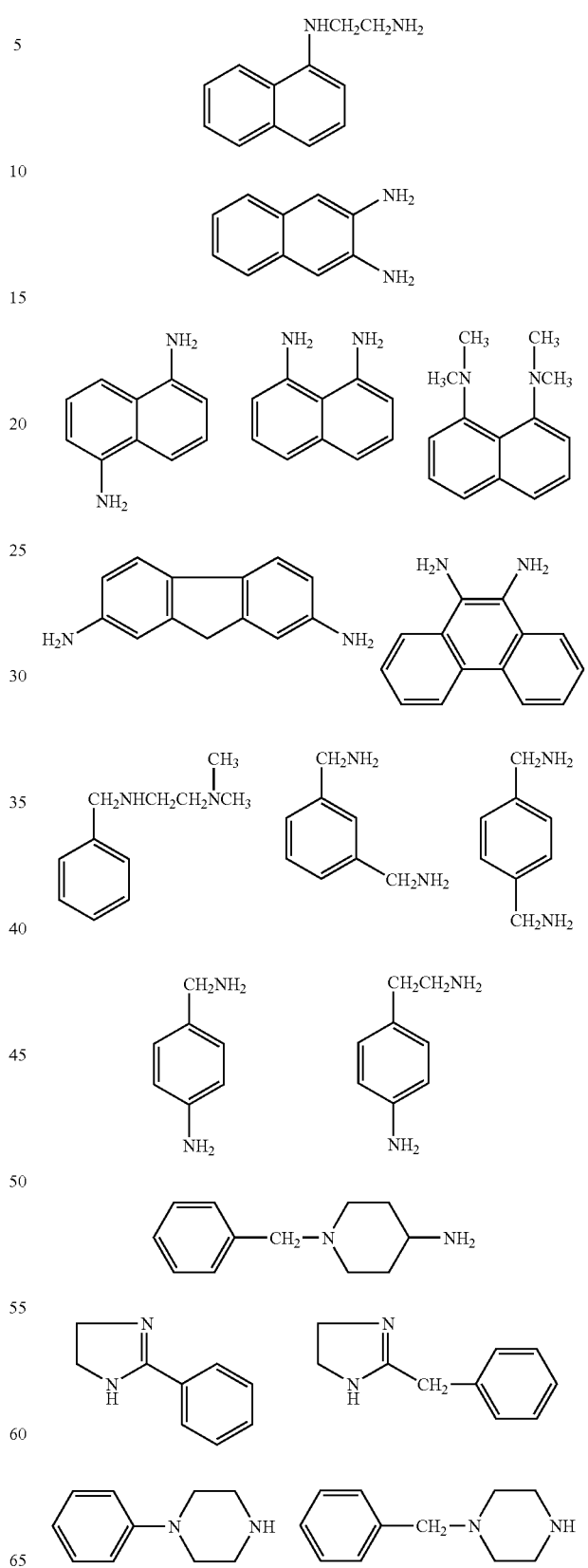

-continued

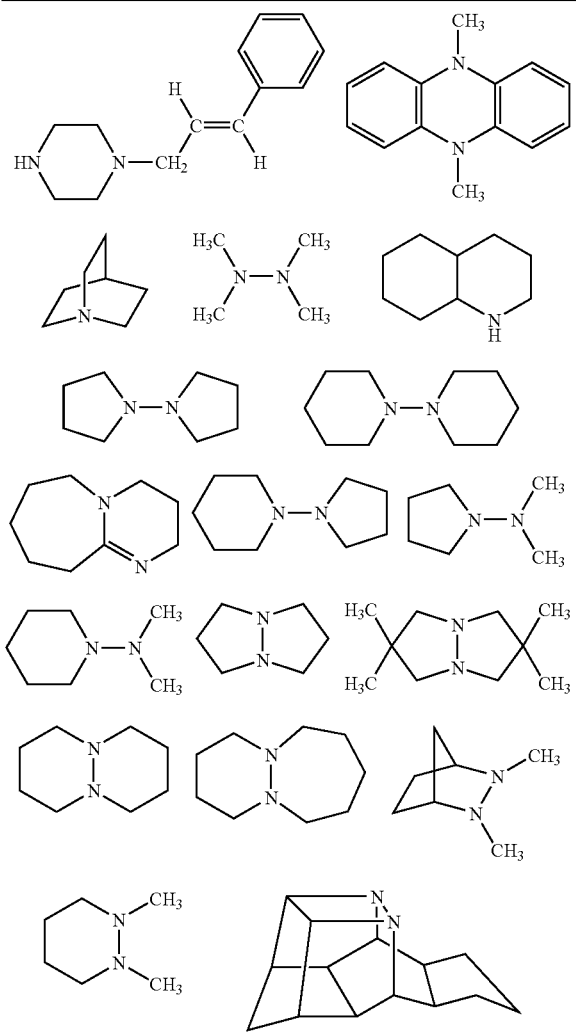

The following will explain n in general formula (I). Here, n represents a molar ratio between the molecular of the acidic dye and the nitrogen-containing compound or aliphatic cyclic amine compound that constitutes a counter ion, in other words a molar ratio (X/Dye) of X to Dye. n may be selected based on the salt-forming condition of "acidic dye-nitrogen containing compound" or "acidic dye-aliphatic cyclic amine compound."

More specifically, n is a value that satisfies $0<n\leq 5$ with respect to the number of functional groups in acid within the acidic dye, and can be appropriately selected by taking into consideration an order of preference of all the required performances, such as solubility with respect to an organic solvent and a developer, a salt-forming property, light absorbency, interaction with the other components in the dye-containing curable composition, light resistance, and heat resistance. When the selection is made only from the viewpoint of light absorbency, n is preferably a value that satisfies $0<n\leq 4.5$, more preferably a value that satisfies $0<n\leq 4.0$, and most preferably a value that satisfies $0<n\leq 3.5$.

The concentration of the organic solvent soluble dye to be applied will be explained below. The concentration of the organic solvent soluble dye based on a total solid component of the dye-containing curable composition defers depending on the kind of dye, but it is preferably 0.5 to 80% by mass, more preferably 0.5 to 60% by mass, and most preferably 0.5 to 50% by mass.

The above-mentioned organic solvent soluble dye represented by general formula (I) can be obtained by a method in which a solution containing a dye and a nitrogen-containing compound or an aliphatic cyclic amine compound is evaporated, and solid-dried or by a method in which this solution is mixed with another solution of a salt compound so as to be salt-exchanged.

—Binder—

The binder will be explained below. The binder of the invention is not particularly limited as long as it is water-soluble or alkali-soluble, and is appropriately selected from the viewpoint of proper heat resistance, developing property and availability.

Those linear organic high molecular weight polymers which are soluble to an organic solvent, and can be developed by a weak alkaline aqueous solution are preferably used as the binder. Examples of such a linear organic high molecular polymer include a polymer having carboxylic acid on its side chain and an acidic cellulose derivative having a carboxylic acid on its side chain. JP-A No. 59-44615, Japanese Patent Application Publication (JP-B) Nos. 54-34327, 58-12577, 54-25957, JP-A Nos. 59-53836 and 59-71048 disclose a methacrylic acid copolymer, an acrylic acid copolymer, an itaconic acid copolymer, a crotonic acid copolymer, a maleic acid copolymer and a partially esterified maleic acid copolymer as a polymer having carboxylic acid on its side chain.

In addition to the above-mentioned compounds, those compounds formed by adding an acid anhydride to a polymer having a hydroxide group, polyhydroxy styrene type resins, polysiloxane type resins, poly(2-hydroxyethyl(meth) acrylate), polyvinyl pyrrolidone, polyethylene oxide, polyvinyl alcohol and the like may also be used.

Moreover, a hydrophilic monomer may be copolymerized to obtain the target compound, and examples thereof include alkoxyalkyl(meth)acrylate, hydroxyalkyl(meth)acrylate, glycerol(meth)acrylate, (meth)acrylamide, N-methylol acrylamide, binary or tertiary alkylacrylamides, dialkylaminoalkyl(meth)acrylate, morpholin(meth)acrylate, N-vinyl pyrrolidone, N-vinyl caprolactam, vinyl imidazole, vinyl triazole, methyl(meth)acrylate, ethyl(meth)acrylate, propyl (meth)acrylate with branched or straight chains, butyl(meth) acrylate with branched or straight chains and phenoxyhydroxypropyl(meth) acrylate.

In addition to these, with respect to the hydrophilic monomer, monomers having a tetrahydrofulfuryl group, phosphoric acid, phosphate, quaternary ammonium salt, ethyleneoxy chains, propyleneoxy chains, sulfonic acid and its salt or a morpholino ethyl group may be used.

Moreover, in order to improve the cross-linking efficiency, a polymerizable group may be placed in the side chain, and polymers and the like having an allyl group, a (meth)acrylic group and an allyloxy alkyl group on the side chain thereof may also be effectively used. Examples of the polymer having a polymerizable group include KS resist-106 (manufactured by Osaka Organic Chemical Industry Ltd.) and Cyclomer P Series (Daicel Chemical Industries, Ltd.). Furthermore, in order to increase the strength of the cured coat film, alcohol soluble nylon, polyether of 2,2-bis-(4-hydroxyphenyl)-propane and epichlorohydrin, and the like may also be used.

Among these various binders, from the viewpoint of heat resistance, polyhydroxy styrene resins, polysiloxane resins, acrylic resins, acrylamide resins and acryl/acryl amide copolymer resins are preferably used, and from the viewpoint of developing-property controlling, acrylic resins, acryl amide resins and acryl/acrylamide copolymer resins are preferably used.

Examples of the above-mentioned acrylic resins include a copolymer made from a monomer selected from the group consisting of benzyl(meth)acrylate, (meth)acrylic acid and hydroxyethyl(meth)acrylate and (meth)acrylic amide, KS Resist-106 (manufactured by Osaka Organic Chemical Industry Ltd.) and Cyclomer P series (Daicel Chemical Industries, Ltd.).

Moreover, alkali-soluble phenol resin is also useful. The resin is preferably used when constituting as the dye-containing curable composition of the invention into a positive-working type structure. Examples of the alkali-soluble phenol resin include novolak resin or vinyl copolymer and the like.

Examples of the above-mentioned novolak resin include those resins obtained by condensing phenols and aldehydes in the presence of an acidic catalyst. Examples of phenols include phenol, cresol, ethylphenol, butylphenol, xylenol, phenylphenol, catechol, resorcinol, pyrogallol, naphthol and bisphenol A. Any of these phenols may be used alone, or two or more kinds of these may be used in combination. Examples of aldehydes include formaldehyde, paraformaldehyde, acetoaldehyde, propion aldehyde and benzaldehyde.

Specific examples of the above-mentioned novolak resin include a condensate of methacresol, paracresol or a mixture thereof and formalin. The molecular weight distribution of these novolak resins may be adjusted by using a classifying means and the like. Moreover, a low-molecular weight component having a phenolic hydroxide group, such as bisphenol C or bisphenol A, may be mixed in the above-mentioned novolak resin.

The binder is preferably a polymer having a weight average molecular weight (on a polystyrene equivalent basis by the use of GPC method) of 1000 to $2\times10^5$, more preferably 2000 to $1\times10^5$, and most preferably 5000 to $5\times10^4$.

The content of the dye-containing curable composition in the above-mentioned binder is preferably 10 to 90% by mass, more preferably 20 to 80% by mass, and most preferably 30 to 70% by mass based on a total solid component (mass) of the composition.

—Cross-linking Agent—

In the invention, it is possible to obtain a film that is cured to a higher degree by additionally using a cross-linking agent. The cross-linking agent will be explained in the following.

The cross-linking agent to be applied to the invention is not particularly limited as long as it carries out a film curing process through a cross-linking reaction. Examples thereof include (a) epoxy resin, (b) a melamine compound, a guanamine compound, a glycol uryl compound or an urea compound that is substituted by at least one substituent selected from the group consisting of a methylol group, an alkoxymethyl group and an acyloxymethyl group, and (c) a phenol compound, a naphthol compound or a hydroxyl anthracene that is substituted by at least one substituent selected from the group consisting of a methylol group, an alkoxymethyl group and an acyloxymethyl group. Among these, polyfunctional epoxy resin is preferably used.

As (a) epoxy resin, any resin may be used as long as it has an epoxy group and a cross-linking property. Examples thereof include divalent glycidyl group-containing low molecular compounds, such as bisphenol A diglycidyl ether, ethylene glycol diglycidyl ether, butane diol diglycidyl ether, hexane diol diglycidyl ether, dihydroxy biphenyl diglycidyl ether, phthalic acid diglycidyl ether and N,N-diglycidyl aniline; also trivalent glycidyl group-containing low molecular compounds, such as trimethylol propane triglycidyl ether, trimethylol phenol triglycidyl ether, TrisP-PA triglycidyl eter, also tetravalent glycidyl group-containing low molecular compounds, such as pentaerythritol tetraglycidyl ether and tetramethylol bisphenol A tetraglycidyl ether; also polyvalent glycidyl group-containing low molecular compounds, such as dipentaerythritol pentaglycidyl ether and dipentaerythritol hexa glycidyl ether; and also glycidyl group-containing polymer compounds, such as polyglycidyl(meth)acrylate and 1,2-epoxy-4-(2-oxyranyl) cyclohexane adduct of 2,2-bis(hydroxymethyl)-1-butanol.

The number of substituting methylol group, alkoxy methyl group and acyloxy methyl group in the cross-linking agent (b) is 2 to 6 in the case of a melamine compound, and 2 to 4 in the case of a glycol uryl compound, a guanamine compound and an urea compound. More preferably, it is 5 to 6 in the case of a melamine compound, and 3 to 4 in the case of a glycol uryl compound, a guanamine compound and an urea compound.

Hereinafter, the above-mentioned (b) melamine compound, guanamine compound, glycol uryl compound and urea compound are also generally referred to as a compound related to (b) (methylol group-containing compound, alkoxy methyl group-containing compound or acyloxy methyl group-containing compound).

The abovementioned methylol group-containing compound related to (b) is obtained by heating the alkoxy methyl group-containing compound related to (b) in alcohol in the presence of an acidic catalyst such as hydrochloric acid, sulfuric acid, nitric acid and methane sulfonic acid. The above-mentioned acyloxy methyl group-containing compound related to (b) is obtained by mixing and stirring the methylol group-containing compound related to (b) with acyl chloride in the presence of a basic catalyst.

Specific examples of compounds related to (b) having the above-mentioned substituent include the following.

Examples of the melamine compound include hexamethylol melamine, hexamethoxymethyl melamine and a compound in which 1 to 5 methylol groups of hexamethylol melamine are methoxy-methylated or mixtures thereof. Examples of the melamine compound also include hexamethoxy ethyl melamine, hexaacyloxy methyl melamine and a compound in which 1 to 5 methylol groups of hexamethylol melamine are acyloxy-methylated or mixtures thereof.

Examples of the above-mentioned guanamine compound include tetramethylol guanamine, tetramethoxy methyl guanamine and compounds in which 1 to 3 methylol groups of tetramethylol guanamine are methoxy-methylated or mixtures thereof, and tetramethoxy ethyl guanamine, tetraacyloxy methyl guanamine and compounds in which 1 to 3 methylol groups of tetramethylol guanamine are acyloxy-methylated or mixtures thereof.

Examples of the above-mentioned glycol uryl compound include tetramethylol glycol uryl, tetramethoxy methyl glycol uryl and compounds in which 1 to 3 methylol groups of tetramethylol glycol uryl are methoxy-methylated or mixtures thereof, and compounds in which 1 to 3 methylol groups of tetramethylol glycol uryl are acyloxy-methylated or mixtures thereof.

Examples of the above-mentioned urea compound include tetramethylol urea, tetramethoxy methyl urea and compounds in which 1 to 3 methylol groups of tetramethylol urea are methoxy-methylated or mixtures thereof, and tetramethoxy ethyl urea.

These compounds related to (b) may be used alone, or may be used in combination.

The above-mentioned cross-linking agent (c), that is, a phenol compound, a naphthol compound or a hydroxy anthracene compound which is substituted by at least one group selected from the group consisting of a methylol group, an alkoxy methyl group and an acyloxy methyl group, makes it possible to prevent inter-mixing with the uppercoat photoresist through thermal cross-linking, and also to further improve the film strength in the same manner as the above-mentioned cross-linking agent (b).

Hereinafter, these compounds are generally referred to as compounds related to (c) (methylol group-containing compound, alkoxy methyl group-containing compound or acyloxy methyl group-containing compound).

With respect to a number of the at least one group selected from a methylol group, an acyloxy methyl group, and an alkoxy methyl group contained in the above-mentioned cross-linking agent (c), two groups are required per molecule at a minimum. From the viewpoint of thermal cross-linking property and storage stability, it is preferable to use a compound in which all the second and fourth positions of the phenol skeleton are substituted. Moreover, in naphthol skeleton and hydroxy anthracene skeleton, it is preferable that all the ortho position and para position of the OH group are substituted. The third position and the fifth position of the phenol compound may be substituted or unsubstitued.

Regarding the above-mentioned naphthol compound, positions other than the ortho position of the OH group may be substituted or unsubstitued.

The methylol group-containing compound related to (c) is obtained from the reaction between a compound, in which ortho position or para position (second position or fourth position) of a phenolic OH group is a hydrogen atom, as a raw material and formalin in the presence of a basic catalyst, such as sodium hydroxide, potassium hydroxide, ammonia and tetraalkyl ammonium hydroxide.

The alkoxy methyl group-containing compound related to (c) is obtained by heating a methylol group-containing compound related to (c) in alcohol in the presence of an acidic catalyst such as hydrochloric acid, sulfuric acid, nitric acid, and methane sulfonic acid.

The acyloxy methyl group-containing compound related to (c) is obtained from the reaction of a methylol group-containing compound related to (c) with acyl chloride in the presence of a basic catalyst.

Examples of the skeleton compound in the cross-linking agent (c) include a phenol compound, naphthol and a hydroxy anthracene compound in which the ortho position or para position of the phenolic OH group is unsubstituted. Specific examples thereof include phenol, the isomers of cresol, 2,3-xylenol, 2,5-xylenol, 3,4-xylenol, 3,5-xylenol, bisphenols such as bisphenol A, 4,4'-bishydroxy biphenyl, TrisP-PA (manufactured by Honshu Chemical Industry Co., Ltd.), naphthol, dihydroxy naphthalene and 2,7-dihydroxy anthracene.

Examples of the cross-linking agent (c) include trimethylol phenol, tri(methoxymethyl)phenol and compounds in which 1 to 2 methylol groups of trimethylol phenol are methoxy-methylated, trimethylol-3-cresol, tri(methoxymethyl)-3-cresol, compounds in which 1 to 2 methylol groups of trimethylol-3-cresol are methoxy-methylated, dimethylol cresol such as 2,6-dimethylol-4-cresol, tetramethylol bisphenol A, tetramethoxy methyl bisphenol A, compounds in which 1 to 3 methylol groups of tetramethylol bisphenol A are methoxy-methylated, tetramethylol-4,4'-bishydroxy biphenyl, tetramethoxymethyl-4,4'-bishydroxy biphenyl, hexamethylol form of TrisP-PA, compounds in which 1 to 5 methylol groups of hexamethoxymethyl form of TrisP-PA, hexamethylol form of TrisP-PA are methoxy-methylated and bishydroxy methyl naphthalene diol.

Moreover, examples of the hydroxy anthracene compound include 1,6-dihydroxymethyl-2,7-dihydroxy anthracene, etc.

Furthermore, examples of the acyloxymethyl group-containing compound include compounds in which a part or all of the methylol groups of the methylol group-containing compound are acyloxy-methylated.

Among these compounds, preferable compounds are trimethylol phenol, bishydroxymethyl-p-cresol, tetramethylol bisphenol A, a hexamethylol form of TrisP-PA (manufactured by Honshu Chemical Industry Co., Ltd.) and phenol compounds in which methylol groups of these compounds are substituted by alkoxymethyl groups or methylol and alkoxymethyl groups.

These compounds related to (c) may be used alone or in combination.

In the invention, it is not always necessary to contain the above-mentioned cross-linking agent. When a cross-linking agent is contained, the total content of the cross-linking agents (a) to (c) in the dye-containing curable composition is preferably 1 to 70% by mass, more preferably 5 to 50% by mass, and most preferably 7 to 30% by mass, based on the solid component (mass) of the curable composition, although it depends on the kind of material.

—Monomer or Oligomer—

A monomer or oligomer having at least one ethylenic unsaturated group will be explained below.

As a monomer or oligomer having at least one ethylenic unsaturated group, a preferable compound contains at least one addition-polymerizable ethylenic double bond and has a boiling point of 100° C. or more under a normal pressure. By containing this monomer or oligomer together with a photopolymerization initiator, the dye-containing curable composition of the invention is constituted into a negative-working structure. This monomer or oligomer may also be contained in a positive-working dye-containing curable composition for the purpose of further improving curing properties.

Examples thereof include monofunctional acrylate and methacrylate such as polyethylene glycol mono(meth) acrylate, polypropylene glycol mono(meth) acrylate and phenoxyethyl (meth) acrylate; compounds obtained by adding ethylene oxide and propylene oxide to polyfunctional alcohols such as polyethylene glycol di(meth)acrylate, trimethylol ethane tri(meth)acrylate, neopentyl glycol di(meth)acrylate, pentaerythritol tri(meth)acrylate, pentaerythritol tri (meth) acrylate, pentaerythritoltetra (meth)acrylate, dipentaerythritol dipentaerythritolpenta (meth)acrylate, dipentaerythritolhexa (meth)acrylate, hexane diol(meth) acrylate, trimethylol propane tri(acryloyloxy propyl) ether, tri(acryloyloxy ethyl) isocyanurate, glycerin and trimethylol ethane and by forming the resulting compound into (meth) acrylate; urethane acrylates disclosed in JP-B Nos. 48-41708, 50-6034 and JP-A No. 51-37193; polyester acrylates disclosed in JP-A No. 48-64183, JP-B Nos. 49-43191 and 52-30490; polyfunctional acrylates and methacrylates such as epoxy acrylates that are produced by a reaction between epoxy resins and (meth)acrylic acid; and mixtures thereof. Moreover, those compounds described on pp. 300 to 308 of Vol. 20, No. 7 in Journal of Japanese Adhesion Association as photo-curable monomers and oligomers are also used.

The content of the above-mention monomer or oligomer dye-containing curable composition is preferably 0.1 to 90% by mass, more preferably 1.0 to 80% by mass, and most preferably 2.0 to 70% by mass, based on the solid component (mass) of the composition.

—Photo-polymerization Initiator, etc.—

Photo-polymerization initiators will be explained below. A photo-polymerization initiator is contained together with the above-mentioned monomer and the like when constituting the dye-containing curable composition of the invention into a negative-working type structure. A photo-polymerization initiator may also be contained, if necessary, when constituting it into a positive-working type structure. The photo-polymerization initiator is not particularly limited as long as it can polymerize the monomer or oligomer, and it may be selected from the viewpoint of properties, initiation efficiency, wavelength of absorbance, availability, and cost performances.

Examples of the above-mentioned photo-polymerization initiator include at least one active halogen compound selected from a halomethyl oxadiazole compound and a halomethyl-s-triazine compound; a 3-aryl-substituted coumarin compound; a lophine dimer; a benzophenone compound; an acetophenone compound and derivatives thereof; a cyclopentadiene-benzene-iron complex and a salt thereof; and an oxime compound.

Examples of the active halogen compound that is a halomethyl oxadiazole compound include a 2-halomethyl-5-vinyl-1,3,4-oxadiazole compound and the like, described in JP-B No. 57-6096, 2-trichloromethyl-5-styryl-1,3,4-oxadiazole, 2-trichloromethyl-5-(p-cyanostyryl)-1,3,4-oxadiazole, 2-trichloromethyl-5-(p-methoxystyryl)-1,3,4-oxadiazole.

Examples of the active halogen compound that is a halomethyl-s-triazine compound include a vinyl-halomethyl-s-triazine compound disclosed in JP-B No. 59-1281, a 2-(naphtho-1-yl)-4,6-bis-halomethyl-s-triazine compound and a 4-(p-aminophenyl)-2,6-di-hallomethyl-s-triazine compound, described in JP-A No. 53-133428.

Specific examples include 2,4-bis(trichloromethyl)-6-p-methoxystyryl-s-triazine, 2,6-bis(trichloromethyl)-4-(3,4-methyleneoxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2-(4-methoxy-naphtho-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl) aminophenyl]-2,6-di(trichloromethyl)-s-triazine, 4-[o-methyl-p-N,N-di(ethoxycarbonylmethyl) aminophenyl]-2,6-di(trichloromethyl)-s-triazine, 4-[p-N,N-di(chloroethyl) aminophenyl]-2,6-di(trichloromethyl)-s-triazine, 4-[o-methyl-p-N,N-di(chloroethyl) aminophenyl]-2,6-di(trichloromethyl)-s-triazine, 4-(p-N-chloroethyl aminophenyl)-2,6-di(trichloromethyl)-s-triazine, 4-(p-N-ethoxycarbonylmethyl aminophenyl)-2,6-di(trichloromethyl)-s-triazine, 4-[p-N,N-di(phenyl) aminophenyl]-2,6-di(trichloromethyl)-s-triazine, 4-(p-N-chloroethylcarbonyl aminophenyl)-2,6-di(trichloromethyl)-s-triazine, 4-[p-N-(p-methoxyphenyl) carbonylaminophenyl]-2,6-di(trichloromethyl)-s-triazine, 4-[m-N,N-di(ethoxycarbonylmethyl) aminophenyl]-2,6-di(trichloromethyl)-s-triazine, 4-[m-bromo-p-N,N-di(ethoxycarbonylmethyl) aminophenyl]-2,6-di(trichloromethyl)-s-triazine, 4-[m-chloro-p-N,N-di(ethoxycarbonylmethyl) aminophenyl]-2,6-di(trichloromethyl)-s-triazine, 4-[m-fluoro-p-N,N-di(ethoxycarbonylmethyl) aminophenyl]-2,6-di(trichloromethyl)-s-triazine, 4-[o-bromo-p-N,N-di(ethoxycarbonylmethyl) aminophenyl]-2,6-di(trichloromethyl)-s-triazine, 4-[o-chloro-p-N,N-di(ethoxycarbonylmethyl) aminophenyl]-2,6-di(trichloromethyl)-s-triazine, 4-[o-fluoro-p-N,N-di(ethoxycarbonylmethyl) aminophenyl]-2,6-di(trichloromethyl)-s-triazine, 4-[o-bromo-p-N,N-di(chloroethyl) aminophenyl]-2,6-di(trichloromethyl)-s-triazine, 4-[o-chloro-p-N,N-di(trichloroethyl) aminophenyl]-2,6-di(trichloromethyl)-s-triazine, 4-[o-fluoro-p-N,N-di(chloroethyl) aminophenyl]-2,6-di(trichloromethyl)-s-triazine, 4-[m-bromo-p-N,N-di(chloromethyl) aminophenyl]-2,6-di(trichloromethyl)-s-triazine, 4-[m-chloro-p-N,N-di(chloroethyl) aminophenyl]-2,6-di(trichloromethyl)-s-triazine, 4-[m-fluoro-p-N,N-di(chloromethyl) aminophenyl]-2,6-di(trichloromethyl)-s-triazine, 4-(m-bromo-p-N-ethoxycarbonylmethyl aminophenyl)-2,6-di(trichloromethyl)-s-triazine, 4-(m-chloro-p-N-ethoxycarbonylmethyl aminophenyl)-2,6-di(trichloromethyl)-s-triazine, 4-(m-fluoro-p-N-ethoxycarbonylmethyl aminophenyl)-2,6-di(trichloromethyl)-s-triazine, 4-(o-bromo-p-N-ethoxycarbonylmethyl aminophenyl)-2,6-di(trichloromethyl)-s-triazine, 4-(o-chloro-p-N-ethoxycarbonylmethyl aminophenyl)-2,6-di(trichloromethyl)-s-triazine, 4-(o-fluoro-p-N-ethoxycarbonylmethyl aminophenyl)-2,6-di(trichloromethyl)-s-triazine, 4-(m-bromo-p-N-chloroethyl aminophenyl)-2,6-di(trichloromethyl)-s-triazine, 4-(m-chloro-p-N-chloroethyl aminophenyl)-2,6-di(trichloromethyl)-s-triazine, 4-(m-fluoro-p-N-chloroethyl aminophenyl)-2,6-di(trichloromethyl)-s-triazine, 4-(o-bromo-p-N-chloroethyl aminophenyl)-2,6-di(trichloromethyl)-s-triazine, 4-(o-chloro-p-N-chloroethyl aminophenyl)-2,6-di(trichloromethyl)-s-triazine, 4-(o-fluoro-p-N-chloroethyl aminophenyl)-2,6-di(trichloromethyl)-s-triazine.

In addition to these, the following compounds are desirably used: TAZ series manufactured by Midori Kagaku Co., Ltd. (for example, TAZ-107, TAZ-110, TAZ-104, TAZ-109, TAZ-140, TAZ-204, TAZ-113, and TAZ-123), T series manufactured by PANCHIM Co., Ltd. (for example, T-OMS, T-BMP, T-R, and T-B), Irgacure series manufactured by Ciba-Geigy, Corp. (for example, Irgacure 651, Irgacure 184, Irgacure 500, Irgacure 1000, Irgacure 149, Irgacure 819, and Irgacure 261), Darocur series (for example, Darocur 1173), 4,4'-bis(diethylamino)-benzophenone, 2-(O-benzoyloxime)-1-[4-(phenylthio) phenyl]-1,2- octane dion, 2-benzyl-2-dimethylamino-4-morpholinobutyrophenone, 2,2-dimethoxy-2-phenyl acetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer and benzoin isopropyl ether.

These photo-polymerization initiator may be used in combination with a sensitizer and a photo-stabilizer.

Specific examples of these include benzoin, benzoin methyl ether, benzoin, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-methoxyxanthone, thioxanthone, 2,4-diethylthioxanthone, acridone, 10-butyl-2-chloroacridone, benzyl, dibenzyl acetone, p-(dimethylamino) phenylstyryl ketone, p-(dimethylamino) phenyl-p-methylstyryl ketone, benzophenone, p-(dimethylamino) benzophenone (or Michler's ketone), p-(diethylamino) benzophenone, benzoanthrone, benzothiazole type compounds and the like described in JP-B No. 51-48516, and Tinuvin 1130 and Tinuvin 400.

In addition to the above-mentioned photo-polymerization initiator, other known initiators may be used in the dye-containing curable composition of the invention.

Specific examples thereof include a vicinal polyketol aldonil compound disclosed in U.S. Pat. No. 2,367,660; an α-carbonyl compound disclosed in U.S. Pat. Nos. 2,367,661 and 2,367,670; acyloin ether disclosed in U.S. Pat. No. 2,448,828; an α-hydrocarbon-substituted aromatic acyloin compound disclosed in U.S. Pat. No. 2,722,512; a polynuclear quinone compound disclosed in U.S. Pat. Nos. 3,046,127 and 2,951,758, a combination of triallylimidazole dimer/p-aminophenyl ketone disclosed in U.S. Pat. No. 3,549,367; and a combination of benzothiazole type compound/trihalomethyl-s-triazine compound disclosed in JP-B No. 51-48516.

The total amount of use of a photo-polymerization initiator (and a known initiator) is from 0.01 to 50% by mass, preferably from 1 to 30% by mass, and most preferably from 1 to 20% by mass, based on the solid content (mass) of monomers or oligomers. If the amount of an initiator is less than 0.01% by mass, polymerization is reluctant to progress. If it exceeds 50% by mass, though polymerization rate increases, the molecular weight may become low and film strength may become weak.

—Thermal Photo-polymerization Inhibitor—

In addition to the above, it is further preferred that a thermal polymerization inhibitor is added to the dye-containing curable composition of the invention. Examples of the thermal polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), 2-mercaptobenzimidazole, etc.

—Naphthoquinone Diazo Compound—

The dye-containing curable composition may contain a naphthoquinone diazo compound, when constituting the dye-containing curable composition of the invention into a positive-working-type structure. Examples of the naphthoquinone diazo compound include o-naphthoquinone diazide-5-sulfonate, o-naphthoquinone diazide-5-sulfonic acid amide, o-naphthoquinone diazide-4-sulfonate, o-naphthoquinone diazide-4-sulfonic acid amide, etc. These esters or amides may be prepared through a known method by using phenol compounds disclosed as general formula (I) in JP-A Nos. 2-84650 and 3-49437.

The above-mentioned binder and cross-linking agent are normally dissolved in a solvent at the respective ratios of approximately 2 to 50% by mass and 2 to 30% by mass, based on the solvent mass. Moreover, the above-mentioned naphthoquinone diazide compound and organic solvent soluble dye are normally dissolved in a solvent that contains the binder and cross-linking agent at the respective ratios of approximately 2 to 30% by mass and 2 to 50% by mass. Moreover, various additives conventionally used in the corresponding technical field, such as a lubricant used for applying an even coating property, may be added to the color-filter-use resist composition.

—Solvent—

Upon preparing the dye-containing curable composition of the invention, a solvent is generally used. Although not particularly limited as long as it satisfies the solubility of each component and coating property of the dye-containing curable composition, the solvent is preferably selected by taking into consideration the solubility, coating property, and safety of the dye and binder.

Preferable examples of the solvents include esters such as ethyl acetate, n-butyl acetate, isobutyl acetate, amyl formate, isoamyl acetate, isobutyl acetate, butyl propionate, isopropyl butyrate, ethyl butyrate, and butyl butyrate; alkyl esters such as methyl lactate, ethyl lactate, methyloxy acetate, ethyloxy acetate, butyloxy acetate, methylmethoxy acetate, ethylmethoxy acetate, butylmethoxy acetate, methylethoxy acetate, and ethylethoxy acetate; 3-oxypropionic acid alkyl esters such as methyl 3-oxypropionate, and ethyl 3-oxypropionate, e.g., methyl 3-methoxypropionate, ethyl 3-methoxypropionate, methyl 3-ethoxypropionate, and ethyl 3-ethoxypropionate; 2-oxypropionic acid alkyl esters such as methyl 2-oxypropionate, ethyl 2-oxypropionate and propyl 2-oxypropionate, e.g., methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate; methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, and propylene glycol propyl ether acetate; ketones such as methyl ethyl ketone, cyclohexanone, 2-heptanone, and 3-heptanone; and aromatic hydrocarbons such as toluene and xylene.

Of these, preferably used compounds are methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate.

—Various Additives—

Various additives can be added to the dye-containing curable composition of the invention, if necessary, e.g., a filler, polymers compound other than those described above, a surfactant, an adhesion accelerator, an antioxidant, an ultraviolet ray absorber, and an agglomeration preventive agent.

Specific examples of these additives include a filler such as glass and alumina; a polymer compound such as polyvinyl alcohol, polyacrylic acid, polyethylene glycol monoalkyl ether other than a binder polymer, and polyfluoroalkyl acrylate; nonionic, cationic and anionic surfactants; an adhesion accelerator such as vinyl trimethoxysilane, vinyl triethoxysilane, vinyl tris(2-methoxyethoxy)silane, N-(2-aminoethyl)-3-aminopropylmethyldimethoxy silane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl) ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; an antioxidant such as 2,2-thiobis(4-methyl-6-t-butylphenol), and 2,6-di-t-butylphenol; an ultraviolet ray absorber such as 2-(3-t-butyl-5-methyl-2-hydroxyphenyl)-5-chlorobenzotriazole, and alkoxybenzophenone; and an agglomeration-preventing agent such as sodium polyacrylate.

Further, an organic carboxylic acid, preferably a low molecular weight organic carboxylic acid having a molecular weight of 1,000 or less, can be added to the dye-containing curable composition of the invention for the purpose of accelerating dissolution of the non-image portion to alkali and further improving the developing property of the dye-containing curable composition.

Specific examples thereof include aliphatic monocarboxylic acid, e.g., formic acid, acetic acid, propionic acid, butyric acid, valeric acid, pivalic acid, caproic acid, diethylacetic acid, enanthic acid, and caprylic acid; aliphatic dicarboxylic acid, e.g., oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acid, e.g., tricarballylic acid, aconitic acid, and camphoronic acid; aromatic monocarboxylic acid, e.g., benzoic acid, toluic acid, cuminic acid, hemellitic acid, and mesitylenic acid; aromatic polycarboxylic acid, e.g., phthalic acid, isophthalic acid, terephthalic acid, trimellitic acid, trimesic acid, mellophanic acid, and pyromellitic acid; and other carboxylic acid, e.g., phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid, and umbellic acid.

The dye-containing curable composition of the invention is preferably used for forming colored pixels for use in color filters and electroluminescence-use color filters that are applied to liquid crystal displays (LCD) and solid image pickup device (for example, CCD, CMOS, etc.), and also used for forming printing ink, ink-jet-use ink and paints.

<<Color Filter and Manufacturing Method Thereof>>

The color filter of the invention will be explained in detail below, together with the manufacturing method thereof.

The manufacturing method of the color filter of the invention employs the dye-containing curable composition, which has already been described above.

When the dye-containing curable composition is to be constituted into a negative-working type structure, firstly the negative-type dye-containing curable composition is applied onto a support by a coating method such as rotary coating, flow coating or roller coating to form a radiation-sensitive composition layer. Secondly, the coated layer is exposed through a prescribed mask pattern, and developed using a developer. Thus, the negative-working-type colored pattern is formed (image-forming process). Moreover, if necessary, this image-forming process may contain a curing step, in which thus formed colored pattern is cured by heating and/or exposure to light.

When the dye-containing curable composition is to be constituted into a positive-working type structure, firstly the positive-type dye-containing curable composition is applied onto a support by a coating method such as rotary coating, flow coating or roller coating to form a radiation-sensitive composition layer. Secondly, the coated layer is exposed through a prescribed mask pattern, and developed using a developer. Thus, the positive-working-type colored pattern is formed (image-forming process). Thus formed colored pattern is heated and cured (post baking).

When employing a negative-working type structure, a color filter having desired hues can be produced by repeating the above-mentioned image-forming processes (and curing processes, if necessary) a number of times corresponding to the number of required hues. When employing a positive-working type structure, a color filter having desired hues can be produced by repeating the above-mentioned image-forming processes and post-baking processes a number of times corresponding to the number of required hues.

Ultraviolet rays such as g-ray, h-ray and i-ray are preferably used as light or radiation.

Examples of the above-mentioned support include soda glass, Pyrex (R) glass, quartz glass, and these glasses having a transparent conductive film bonded thereon, which may be used in liquid crystal display devices and the like. Examples of the support also include photoelectric conversion device substrates used for image pickup devices and the like, for instance, silicon substrates, complementary metal oxide film semiconductors (CMOS) and the like. In some cases such a support may have thereon a black stripe that is used for separating each pixel.

Moreover, an undercoat layer may be formed on the support, if necessary, in order to improve the adhesion with an upper layer, to prevent substance dispersion or to flatten the substrate surface.

As the above-mentioned developer, any developer may be used as long as it dissolves uncured portions of the dye-containing curable composition of the invention without dissolving cured portions. Specific examples thereof include various kinds of combinations of organic solvents and alkaline aqueous solutions. The organic solvents include the above-mentioned solvents to be used upon preparing the dye-containing curable composition of the invention.

The above-mentioned alkaline solution may be prepared by dissolving alkaline compounds such as sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, and 1,8-diazabicyclo[5,4,0]-7-undecene. These alkaline compounds are preferably dissolved at a concentration of 0.001 to 10% by mass, and more preferably 0.01 to 1% by mass. When a developer comprising such an alkaline aqueous solution is used, the color filter is, in general, washed with water after development.

The color filter of the invention is preferably used for CCD devices, CMOS and the like which have a high degree of resolution exceeding 1,000,000 pixels, in particular. The color filter of the invention may be used as a color filter to be placed between a light-receiving unit of each pixel constituting CCDs and a microlens used for condensing light.

EXAMPLES

The present invention is described in detail below by examples, but the invention is not limited thereto. Here, "parts" are defined on a mass basis, unless otherwise indicated.

| (1) Preparation of resist solution | |
|---|---|
| Propylene glycol monomethyl ether acetate (PGMEA) | 19.20 parts |
| Ethyl lactate | 36.67 parts |
| Binder [41% PGMEA solution of benzyl methacrylate/methacrylate/methacrylate-2-hydroxyethyl copolymer (molar ratio = 60:20:20)] | 30.51 parts |
| Dipentaerythritol hexacrylate | 12.20 parts |
| Polymerization inhibitor (p-methoxyphenol) | 0.0061 parts |
| Fluorine type surfactant (F-475, manufactured by Dainippon Ink and Chemicals, Incorporated) | 0.83 parts |
| Photo-polymerization initiator (TAZ-107, manufactured by Midori Kagaku Co., Ltd.) | 0.586 parts |

The above-mentioned compounds are mixed and dissolved to prepare a resist solution.

(2) Preparation of a Glass Substrate with an Undercoat Layer

A glass substrate (Corning 1737) is subjected to an ultrasonic-wave washing process with a 1% NaOH aqueous solution, washed and baked to be dehydrated (200° C./30 minutes). The resist solution obtained by the above-mentioned process (1) is applied onto the washed glass substrate, by a spin coater so as to have a film thickness of 2 μm. It is heated at 220° C. for one hour to be dried, and a cured film (a undercoat layer) is formed.

(3) Preparation of a Dye Resist Solution

The resist solution (9.4 parts) obtained through the above-mentioned process (1) and 0.6 parts of tetramethylethylene diamine salt of acid yellow 42 [compound represented by general formula (I), nitrogen-containing compound or aliphatic cyclic amine compound (X)/acidic dye (Dye)=1.50 (molar ratio)] are mixed and dissolved to obtain a dye resist solution (a solution of the dye-containing curable composition of the invention).

(4) Exposing and Developing Processes of a Dye-containing Curable Composition (Image-forming Process)

The dye resist solution obtained through the above-mentioned process (3) is applied onto the undercoat layer of the glass substrate obtained through the above-mentioned process (2) by a spin coater so as to have a film thickness of 1 μm. It is pre-baked thereafter at 120° C. for 120 seconds.

Next, the coated film is irradiated with light having a wavelength of 365 nm through a 20 μm mask at 800 mJ/cm$^2$ using an i-ray condensed projection exposing device. After the irradiation, it is subjected to a developing process at 26° C. for 90 seconds using a 60% CD-2000 developer (manufactured by FUJIFILM Arch Co., Ltd.). Next, it is rinsed with flowing water for 20 seconds, and spray-dried to obtain a yellow pattern image. The formation of the image is confirmed by a normal method through an optical microscope and observation of SEM photographs.

(5) Evaluation

The following evaluation processes are carried out on the yellow pattern image (image made of the dye-containing curable composition). The results of evaluation are shown in Table 1.

(i) Developing Property and Film Remaining Rate

The developing property at unexposed portions and the film remaining rate at exposed portions are measured by a chromoscope MCPD-1000 (a product of Otsuka Electronics Co., Ltd.). The developing property of unexposed portions refers to an absorbance change rate [%] of the film before and after a developing process, and a greater value means superior developing property. The film remaining rate of exposed portions refers to an absorbance maintaining rate [%] of the film before and after a developing process, and a greater value means a superior pattern shape.

(ii) Solvent Resistance

The glass substrate with an undercoat layer on which the yellow pattern image is formed is immersed in an ethyl lactate at room temperature for 10 minutes. Then, change in the chromaticity of the pattern image, that is, ΔEab value, is measured using a chromoscope MCPD-1000 (Otsuka Electronics Co., Ltd.). A smaller ΔEab value means superior solvent resistance.

(iii) Heat Resistance

The glass substrate with an undercoat layer, on which the yellow pattern image is formed, is heated at 200° C. for one hour with a hot plate placed so that the hot plate contact the face of the substrate. Then, change in the chromaticity of the pattern image, that is, ΔEab value, is measured using a chromoscope MCPD-1000 (Otsuka Electronics Co., Ltd.). Here, a smaller ΔEab value means superior heat resistance.

(iv) Light Resistance

The glass substrate with an undercoat layer, on which the yellow pattern image is formed, is irradiated with xenon light with 200,000 Lux for 10 hours (corresponding to 2,000,000 Lux·h). Then, change in the chromaticity of the pattern image, that is, ΔEab value, is measured. Here, a smaller ΔEab value means superior light resistance.

Furthermore, a second color is coated on the glass substrate with an undercoat layer, on which the yellow pattern image is formed, the second color being prepared by replacing the yellow organic solvent-soluble dye in the above-mentioned (3) dye resist solution with a dye of a different color. Dye elusion and color mixing at the time of the coating process are evaluated based on an absorbance change before and after the image formation of the second color.

Examples 2 to 9, Comparative Examples 1 and 2

A dye resist solution is prepared, a pattern image is formed, and the evaluation is carried out in the same manner as in Example 1 except in that, in each example or comparative example, the tetramethyl ethylene diamine salt [X/Dye (molar ratio)=1.50] of acid yellow 42 used for preparing the dye resist solution is replaced by one of organic solvent soluble dyes shown in the following Table 1.

TABLE 1

| | Organic solvent soluble dye (Dye · X$_n$) | | | X/Dye ratio [mol] (=n) | Unexposed portion developing property [%] | Exposed portion film-remaining rate [%] | Heat resistance ΔEab (200° C./1 h) | Light resistance ΔEab (2M Lux · h) | Solvent resistance (10 min. In EL) |
|---|---|---|---|---|---|---|---|---|---|
| | Dye | X | Mw | | | | | | |
| Example 1 | Acid Yellow 42 | \N~~~N/ | 116 | 1.50 | 100 | 95 | 1.7 | 11.5 | 1.2 |
| Example 2 | Acid Yellow 111 | \N~~~N/ | 116 | 1.00 | 100 | 97 | 2.2 | 2.5 | 2.1 |
| Example 3 | Acid Yellow 112 | \N~~~N/ (with N-methyl) | 116 | 1.00 | 100 | 96 | 2.6 | 3.4 | 1.8 |
| Example 4 | Acid Yellow 114 | \N~~~N/ (with N-methyl) | 116 | 1.00 | 100 | 95 | 2.5 | 3.7 | 1.6 |
| Example 5 | Acid Yellow 116 | H$_2$N~~~NH$_2$ | 60 | 1.00 | 100 | 97 | 3.5 | 3.5 | 1.5 |
| Example 6 | Acid Red 42 | H$_2$N~~~NH$_2$ | 60 | 1.00 | 100 | 96 | 3.8 | 3.1 | 1.3 |
| Example 7 | Acid Red 57 | HN(CH$_2$CH$_2$)$_2$NH (piperazine) | 86 | 1.00 | 100 | 95 | 3.8 | 3.5 | 1.8 |
| Example 8 | Acid Yellow 143 | pyrrolidine (NH) | 71 | 1.00 | 100 | 96 | 3.9 | 3.5 | 1.5 |
| Example 9 | Acid Blue 25 | pyrrolidine (NH) | 71 | 1.00 | 100 | 97 | 3.5 | 3.3 | 1.3 |
| Comparative Example 1 | Acid Yellow 42 | pyridine | 79 | 2.00 | 100 | 94 | 10.3 | 17.4 | 18.8 |
| Comparative Example 2 | Acid Yellow 42 | dehydroabiethylamine | 285 | 2.00 | 60 | 70 | 15.5 | 20.5 | 20.6 |

1*: based on ditolylguanidine salt (per weight)

As shown in the Examples of Table 1, superior results were obtained by using the dye-containing curable composition of the invention, containing an organic solvent soluble dye composed of a salt of an acidic dye and one of a nitrogen-containing compound with a molecular weight of 250 or less having two nitrogen atoms and a cyclic amino compound having no unsaturated bond. Further, the developing property of unexposed portions and the curing property of exposed portions (developing film remaining property) are superior, and consequently a pattern image having a high resolution is provided. Moreover, even when the formed pattern contacts a solvent, the shape and hues are not damaged, providing superior solvent resistance. Changes due to heat and light are also reduced, exhibiting superior heat resistance and light resistance. On the other hand, inferior results are shown in Comparative Examples 1 or 2, in which a dye-containing curable composition contains an organic solvent soluble dye that has, as a counter ion, a cyclic amino compound having an unsaturated bond with a molecular weight exceeding 250 or an aromatic amine (nitrogen-containing compound) having only one nitrogen atom. Inferior results are obtained in the solvent resistance, heat resistance and light resistance. Moreover, Comparative Example 2 fails to provide sufficient developing property and pattern curing property (film remaining rate).

Examples 10 to 18

Pattern images are obtained in the same operations as Examples 1 to 9 except in that the glass substrate used in Examples 1 to 9 is replaced by a silicon wafer substrate. With respect to the heat resistance, unexposed portion developing property and exposed portion film-remaining rate, the same results as Examples 1 to 9 are obtained.

Examples 10 to 18 are different from Examples 1 to 9 in that the silicon wafer substrate is used; however, since the dye-containing curable composition is applied onto the undercoat layer through all the Examples 1 to 18, there are virtually no difference, making it possible to provide the same performances.

Examples 19 to 21

A dye resist solution is prepared, a pattern image is formed, and the evaluation is carried out in the same manner as in Example 1 except in that in each example the tetramethyl ethylene diamine salt [X/Dye (molar ratio)=1.50] of acid yellow 42 used for preparing the dye resist solution is replaced by one of organic solvent soluble dyes shown in the following Table 2.

Furthermore, the present invention provides a color-filter manufacturing method with high cost performances (high efficiency and high productivity). This color-filter manufacturing method makes it possible to form and cure patterns with high sensitivity and high hardness and to prevent the elusion and mixture (mixed colors) of the dye. This color-filter manufacturing method provides a color filter superior particularly in the solvent resistance of each color pattern, in hues, in resolution, in heat resistance, and in light resistance.

TABLE 2

| | Organic solvent soluble dye (Dye · $X_n$) | | | | Unexposed portion | Exposed portion film- | Heat resistance | Light resistance | Solvent resistance |
|---|---|---|---|---|---|---|---|---|---|
| | Dye | X | Mw | X/Dye ratio [mol] (=n) | developing property [%] | remaining rate [%] | $\Delta Eab$ (200° C./1 h) | $\Delta Eab$ (2M Lux · h) | (10 min. In EL) |
| Example 19 | Acid Yellow 42 | (bicyclic diamine structure) | 112 | 2.00 | 100 | 96 | 1.7 | 2.5 | 1.3 |
| Example 20 | Acid Yellow 111 | $H_3C$\\N—N/$CH_3$ $H_3C$/  \\$CH_3$ | 88 | 1.00 | 100 | 98 | 2.3 | 2.7 | 1.9 |
| Example 21 | Acid Yellow 112 | (dipyrrolidinyl structure) N—N | 140 | 1.00 | 100 | 98 | 2.5 | 2.6 | 1.7 |

1*: based on ditolylguanidine salt (per weight)

As shown in Table 2, superior results are obtained by using the organic solvent soluble dye of the Examples, in which the organic solvent soluble dye is composed of a salt of an acidic dye and one of a nitrogen-containing compound having two nitrogen atoms with a molecular weight of 250 or less and a cyclic amino compound having no unsaturated bond. The developing property of unexposed portions and the curing property of exposed portions (developing film remaining property) are superior, and consequently a pattern image having a high resolution is provided.

Further, superior solvent resistance without causing damages to the shape and hues even when the formed pattern contacts a solvent. Moreover, changes due to heat and light are also reduced, exhibiting superior heat resistance and light resistance.

According to the present invention, it becomes possible to provide a dye-containing curable composition having high sensitivity, superior curing property, and wide developing latitudes. In particular, it is superior in the solvent resistance in an image portion (for example, pixels) after the curing process, in curing property, and in heat resistance. Thus, it becomes possible to form a good pattern image having superior hues with a high degree of resolution.

Additionally, according to the present invention, it is possible to provide a color filter, which is produced with the above-mentioned dye-containing curable composition, having high transmittance, high resolution, and wide developing latitudes. It is also superior in the solvent resistance, curing property and heat resistance, exhibiting high productivity.

What is claimed is:

1. A dye-containing composition comprising a binder and an organic solvent soluble dye, wherein the organic solvent soluble dye is a compound represented by the following general formula (I), Dye·$X_n$     General formula (I)

wherein Dye represents an acidic dye portion having at least one of a sulfonic acid group and a carboxylic acid group; X represents a portion which is derived from at least one selected from the group consisting of a nitrogen-containing compound with a molecular weight of 250 or less having carbon, hydrogen, and two or more nitrogen atoms, and an aliphatic cyclic amine compound with a molecular weight of 250 or less having carbon, hydrogen, and one or more nitrogen atoms; and n represents a value that satisfies $0 < n \leq 5$, and wherein the dye-containing composition is a dye-containing curable composition.

2. The dye-containing composition of claim 1, wherein Dye in general formula (I) is a portion derived from at least one selected from the group consisting of an azo-type acidic dye, a xanthene-type acidic dye, and a phthalocyanine-type acidic dye.

3. The dye-containing composition of claim 1, wherein Dye in general formula (I) is a portion derived from at least one selected from the group consisting of a monoazo-type acidic dye and a bisazo-type acidic dye.

4. The dye-containing composition of claim 1, wherein the at least one of a nitrogen-containing compound and an aliphatic cyclic amine compound in general formula (I) has a molecular weight of 60 to 230.

5. The dye-containing composition of claim 1, wherein the at least one of a nitrogen-containing compound and an aliphatic cyclic amine compound in general formula (I) is a hydrazine-type compound represented by the following general formula (II),

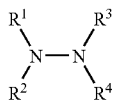
General formula (II)

wherein each of $R^1$, $R^2$, $R^3$ and $R^4$ independently represents a straight or branched alkyl group; a total number of carbon atoms in $R^1$ to $R^4$ is 14 or less; $R^1$, $R^2$, $R^3$ and $R^4$ may be bonded to each other to form an aliphatic ring; and $R^1$, $R^2$, $R^3$ and $R^4$ may be bonded to each other to form a bicyclo-ring when provided with branched chains.

6. The dye-containing composition of claim 1, wherein n in general formula (I) satisfies $0<n\leq4.5$.

7. The dye-containing composition of claim 1, wherein n in general formula (I) satisfies $0<n\leq4$.

8. The dye-containing composition of claim 1, wherein n in general formula (I) satisfies $0<n\leq3.5$.

9. The dye-containing composition of claim 1, wherein the organic solvent soluble dye is contained in an amount of 0.5 to 80% by mass based on a total solid component of the dye-containing curable composition.

10. The dye-containing composition of claim 1, wherein a content of the binder is 10 to 90% by mass based on a total solid component of the dye-containing curable composition.

11. The dye-containing composition of claim 1, wherein the binder is a water-soluble or alkali-soluble binder, and the dye-containing curable composition further contains a photo-polymerization initiator and a monomer or oligomer that contains at least one ethylenic unsaturated group.

12. The dye-containing composition of claim 11, further comprising a cross-linking agent.

13. The dye-containing composition of claim 1, wherein X represents a portion which is derived from an aliphatic cyclic amine compound with a molecular weight of 250 or less having carbon, hydrogen, and one or more nitrogen atoms.

14. A color filter comprising a dye-containing composition containing a binder and an organic solvent soluble dye, wherein the organic solvent soluble dye is a compound represented by the following general formula (I), Dye·$X_n$    General formula (I)

wherein Dye represents an acidic dye portion having at least one of a sulfonic acid group and a carboxylic acid group; X represents a portion which is derived from at least one selected from the group consisting of a nitrogen-containing compound with a molecular weight of 250 or less having carbon, hydrogen, and two or more nitrogen atoms, and an aliphatic cyclic amine compound with a molecular weight of 250 or less having carbon, hydrogen, and one or more nitrogen atoms; and n represents a value that satisfies $0<n\leq5$, and wherein the dye-containing composition is a dye-containing curable composition.

15. The color filter of claim 14, wherein X represents a portion which is derived from an aliphatic cyclic amine compound with a molecular weight of 250 or less having carbon, hydrogen, and one or more nitrogen atoms.

16. A method of manufacturing a color filter, comprising the steps of:
applying a dye-containing composition containing a binder and an organic solvent soluble dye onto a support, wherein the dye-containing composition is a dye-containing curable composition;
exposing the dye-containing curable composition through a mask; and
developing the dye-containing curable composition to form a pattern,
wherein the organic solvent soluble dye is a compound represented by the following general formula (I), Dye·$X_n$    General formula (I)

wherein Dye represents an acidic dye portion having at least one of a sulfonic acid group and a carboxylic acid group; X represents a portion which is derived from at least one selected from the group consisting of a nitrogen-containing compound with a molecular weight of 250 or less having carbon, hydrogen, and two or more nitrogen atoms, and an aliphatic cyclic amine compound with a molecular weight of 250 or less having carbon, hydrogen, and one or more nitrogen atoms; and n represents a value that satisfies $0<n\leq5$.

17. The method of claim 16, further comprising a step of curing the formed pattern by at least one of heating and exposure to light.

* * * * *